United States Patent
Perez et al.

(10) Patent No.: US 6,552,430 B1
(45) Date of Patent: Apr. 22, 2003

(54) BALL GRID ARRAY SUBSTRATE WITH IMPROVED TRACES FORMED FROM COPPER BASED METAL

(75) Inventors: Paul Gabriel D. Perez, Baguio (PH); Ma Celine R. Mandapat, Baguio (PH); Ferdinand B. Arabe, Baguio (PH); Alvin O. Soria, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/061,030

(22) Filed: Jan. 30, 2002

(51) Int. Cl.[7] ............... H01L 21/302; H01L 21/461
(52) U.S. Cl. ............... 257/738; 257/678; 257/690; 257/693; 257/784
(58) Field of Search ............... 257/678, 690, 257/693, 707, 738, 779, 784

(56) References Cited

U.S. PATENT DOCUMENTS

| | | | |
|---|---|---|---|
| 5,541,450 A | * | 7/1996 | Jones et al. ............ 257/697 |
| 5,592,025 A | * | 1/1997 | Clark et al. ............ 257/774 |
| 5,831,832 A | * | 11/1998 | Gillette et al. .......... 361/760 |
| 5,841,191 A | * | 11/1998 | Chia et al. ............ 257/691 |
| 5,859,475 A | * | 1/1999 | Freyman et al. ......... 257/738 |
| 5,990,547 A | * | 11/1999 | Sharma et al. .......... 257/700 |
| 6,278,613 B1 | * | 8/2001 | Fernandez et al. ....... 361/719 |
| 6,331,451 B1 | * | 12/2001 | Fusaro et al. .......... 438/126 |

* cited by examiner

*Primary Examiner*—David Nelms
*Assistant Examiner*—Andy Huynh
(74) *Attorney, Agent, or Firm*—Wade James Brady, III; Frederick J. Telecky, Jr.

(57) ABSTRACT

A micro-BGA style package for semiconductor device comprises a semiconductor chip and a package substrate. The semiconductor chip includes a plurality of conductive pads. A plurality of transistor circuits are formed upon the semiconductor chip. The package substrate has first and second sides. A plurality of conductive terminals are formed on the first side of the package substrate. At least one of the terminals is electrically coupled to at least one of the conductive pads. A plurality of contacts are formed on the second side of the package substrate. A plurality of traces are disposed on the first side of the package substrate. Each trace provides at least part of an electrical coupling between at least one of the terminals and at least one of the contacts. The traces are formed from a copper based metal having a tensile strength of more than about 60 kg per mm$^2$.

22 Claims, 5 Drawing Sheets

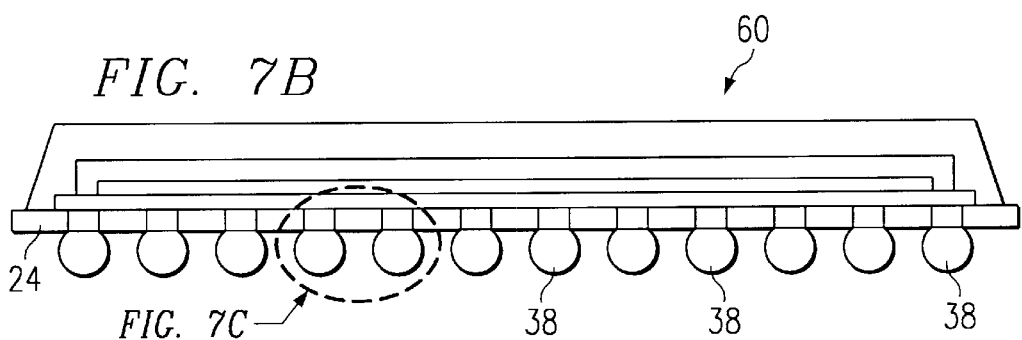
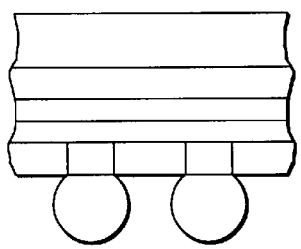
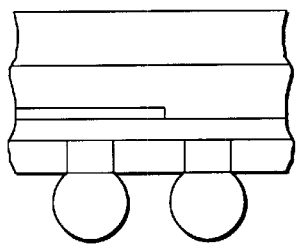
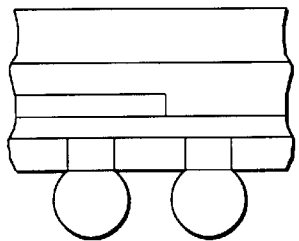
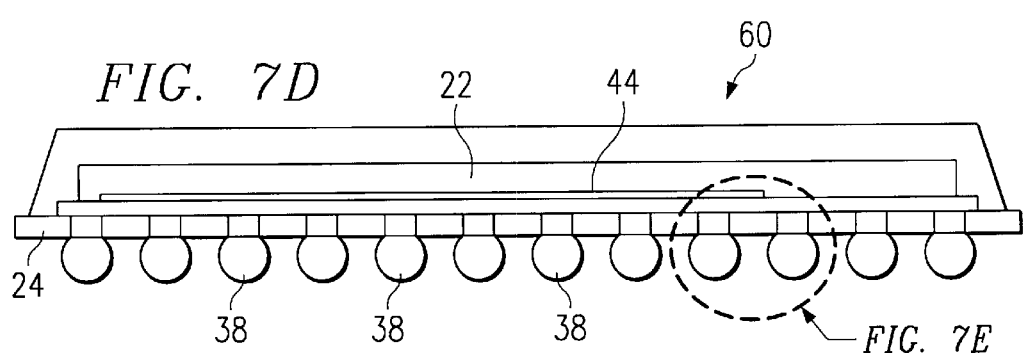
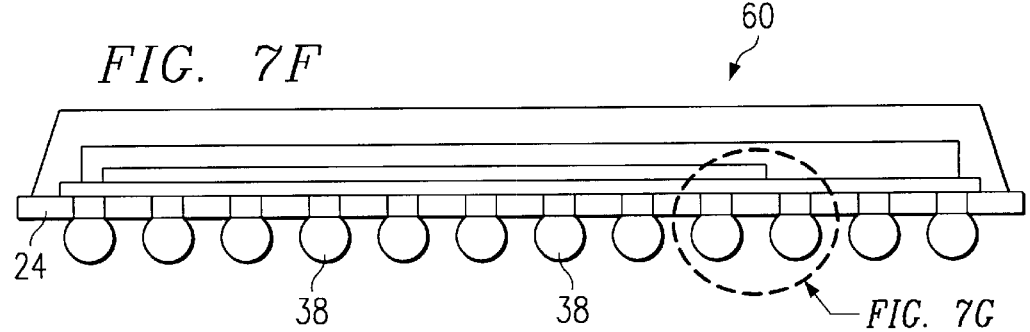

BALL GRID ARRAY SUBSTRATE WITH IMPROVED TRACES FORMED FROM COPPER BASED METAL

FIELD OF THE INVENTION

The present invention relates to ball grid array substrates having traces formed from a copper-based metal. In one aspect, it relates to micro ball grid array integrated circuit packages.

BACKGROUND

Integrated circuits are usually formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are generally packaging related.

The integrated circuit should be packaged in a suitable medium that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a surface where, following adhesion of the chip to the surface and wire bonding, an encapsulant is placed over the chip to seal and protect the chip and other components.

The use of ball grid arrays (BGAs) to package electronic circuits and devices such as semiconductor dies or integrated circuit chips is becoming more prevalent. BGA packaging has proven to provide substantial advantages over other packaging techniques such as, for example, dual in-line packages (DIPs), pin grid array (PGA) packages, tape carrier packages (TCPs), and quad flat packs (QFPs). The advantages of BGA packaging become especially significant when used to package dies or chips having a high pin count and when used to package devices employing high frequency signals. BGA packaging provides the additional advantage of being able to use conventional surface mount technologies (SMTs) and assembly techniques when mounting BGA packages to a printed circuit board (PCB).

A BGA package generally includes a die or chip, multiple substrate layers, and a heat spreader. The die is generally mounted on the heat spreader/stiffener using a thermally conductive adhesive or glue, such as an epoxy. One of the substrate layers includes a signal plane that provides various signal lines or traces that can be coupled to a corresponding die bond pad using a wire bond. The signal traces are then coupled with a solder ball at the other end. As a result, an array of solder balls is formed so that the BGA package may be electrically and mechanically coupled to other circuitry, generally through a PCB, using the array of solder balls that is referred to as a ball grid array.

BRIEF SUMMARY OF THE INVENTION

A micro ball grid array (micro-BGA) substrate has numerous metal traces formed thereon and/or therein. Such traces electrically couple terminals on a first side of the substrate to ball shaped contacts on a second side of the substrate. A semiconductor chip, which may comprise numerous transistor circuits, is usually affixed to the substrate by a layer of epoxy. Hence, in such case, the epoxy bonds to the chip and to the first side of the substrate. The epoxy layer over the traces, as well as the composite structure formed with the traces sandwiched therein, helps strengthen the trace structure. However, the epoxy layer often does not cover 100% of the traces. As a result, the portions of the traces without epoxy thereon tend to be weaker than those with the epoxy thereon. Also, because the substrate is not bonded to the chip at the portions without epoxy, such portions may experience more flexing and/or elongation. The inventors of the present invention have found that trace cracks tend to develop where there is no epoxy, and typically at the epoxy boundary. Such trace cracks often cause a discontinuity that prevents electrical current from traveling along the trace as intended. In one aspect, the present invention provides a way to reduce or eliminate the occurrence of such trace cracking.

In accordance with one aspect of the present invention, a packaged semiconductor device is provided. The device comprises a semiconductor chip and a package substrate. The semiconductor chip includes a plurality of conductive pads. A plurality of transistor circuits are formed upon the semiconductor chip. The package substrate has first and second sides. A plurality of conductive terminals are formed on the first side of the package substrate. At least one of the terminals is electrically coupled to at least one of the conductive pads. A plurality of contacts are formed on the second side of the package substrate. A plurality of traces are disposed on the first side of the package substrate. Each trace provides at least part of an electrical coupling between at least one of the terminals and at least one of the contacts. The traces are formed from a metal having a tensile strength of more than about 60 kg per mm$^2$. The metal of the traces is preferably a copper based material.

The contacts may be arranged in an array, and the array may be generally configured in a square grid. The contacts on the package substrate may be arranged in a micro ball grid array within a generally square area having dimensions between about 3 mm by 3 mm and about 23 mm by 23 mm. The generally square area for the contacts is often dictated by the dimensions of the chip installed on the package by allowing a maximum spacing on each side of the chip of about 0.35 mm to the solder mask edge, which bounds the area of the contacts. Thus for a 9.3 mm by 9.3 mm chip, for example, with a 0.35 package border allowance around the chip, the area of the contacts is about 10 mm by 10 mm. The package substrate may be generally planar shaped with the first side facing an opposite direction with respect to the second side. The device may further comprise an epoxy layer between the chip and the substrate such that the epoxy layer is bonded to the chip and the substrate to, among other things, affix the chip to the substrate. The substrate may be a flex tape substrate, which may comprise a polyimide material, for example. In alternative, the substrate may be a rigid laminate substrate, which may comprise a bismaleimide-triazine resin (BT-resin), flame retardant fiberglass composite substrate board (e.g., FR-4), and/or a ceramic substrate material. The metal of the traces also may have a percent elongation of at least about 7% at room temperature and/or a percent elongation of at least about 7% at 180° C.

In accordance with another aspect of the present invention, a semiconductor device having a micro ball grid array package is provided. The device comprises an integrated circuit chip and a micro ball grid array package substrate. The integrated circuit chip comprises a plurality of conductive pads and a plurality of transistor circuits. At least some of the conductive pads are electrically coupled to at least some of the transistor circuits. The micro ball grid array package substrate has a first side and a second side. A plurality of conductive terminals are formed on the first side of the micro ball grid array package substrate. At least one of the terminals of the micro ball grid array package substrate is electrically coupled to at least one of the conductive pads of the integrated circuit chip. An array of generally ball-shaped contacts is formed on the second side of the micro ball grid array package substrate. A plurality of traces are formed on the first side of the package substrate. Each trace provides at least part of an electrical coupling between at least one of the terminals and at least one of the contacts. The traces are formed from a copper based metal having a tensile strength of more than about 60 kg per mm$^2$. The metal of the traces also may have a percent elongation of at least about 7% at room temperature and/or a percent elongation of at least about 7% at 180° C.

BRIEF DESCRIPTION OF THE DRAWINGS

Other objects and advantages of the invention will become apparent upon reading the following detailed description and upon referencing the accompanying drawings, in which.

DETAILED DESCRIPTION OF THE INVENTION

Figure 1:
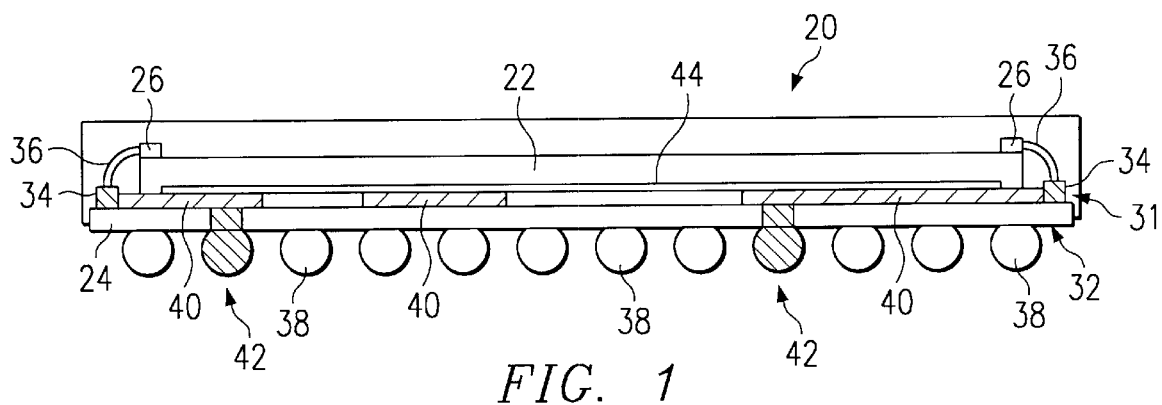
FIG. 1 is a simplified drawing showing a cross-sectional side view of semiconductor device having a micro ball grid array package.

Referring now to the drawings, wherein like reference numbers are used herein to designate like elements throughout the various views, a preferred embodiment of the present invention is illustrated and described. The figures are not necessarily drawn to scale, and in some instances the drawings may be exaggerated and/or simplified in places for illustrative purposes only.

Note that the term "copper" or the abbreviation "Cu" as used herein is a shorthand to refer to any copper-based metal and is not necessarily pure copper. Also, note that the term "die" is considered interchangeable with the term "chip" and/or "semiconductor chip," as used herein.

FIG. 1 is a simplified drawing showing a cross-sectional side view of semiconductor device 20 having a micro ball grid array (micro-BGA) package. The device 20 comprises an integrated circuit semiconductor chip 22 and a micro-BGA package substrate 24. The integrated circuit chip 22 comprises a plurality of transistor circuits therein and a plurality of conductive pads 26. The conductive pads 26 provide electrical connecting points between things outside of the chip 22 and the circuits on the chip 22. The micro-BGA package substrate 24 of the embodiment shown is FIG. 1 is a flexible tape substrate comprising a polyimide material. However, in other embodiments of the present invention, other types of substrates 24 may be used. For example, the substrate 24 may be a rigid laminate comprising a bismaleimide-triazine resin (BT-resin), flame retardant fiberglass composite substrate board (e.g., FR-4), and/or a ceramic substrate material. The substrate 24 has a first side 31 and a second side 32. Preferably the substrate 24 is generally planar shaped and flat, such that the first side 31 faces in an opposite direction with respect to the second side 32, as shown in FIG. 1. However, the substrate 24 may have other shapes and more than two sides in other embodiments. Also, the substrate 24 may be a chip-scale package, e.g., having dimensions within about 1.2 times the size of the chip 22.

Still referring to FIG. 1, the substrate 24 has a plurality of conductive terminals 34 formed on the first side 31. The conductive terminals 34 of the substrate 24 are electrically coupled to the contact pads 26 of the chip 22 by bond wires 36. An array of generally ball-shaped contacts 38 are formed on the second side 32 of the substrate 24. The array of contacts 38 is arranged in a square grid, with a generally square area having dimensions of about 10 mm by 10 mm. In other embodiments, the generally square area for the array of contacts 38 may have dimensions between about 3 mm by 3 mm and about 23 mm by 23 mm, for example. A plurality of conductive traces 40 are disposed on the first side 31 of the substrate. There may be other traces within the substrate 24. For example, the substrate 24 may have multiple layers with traces on multiple levels. As illustrated in FIG. 1 by the two sets of shaded trace routings 42, the traces 40 electrically couple the terminals 34 to the contacts 38.

The epoxy layer 44 over the traces 40, as well as the composite structure formed by the epoxy 44 with the traces 40 sandwiched between the chip 22 and the substrate 24, helps strengthen the trace structures 40. However, as shown in FIGS. 2–5 the epoxy layer 44 often does not cover 100% of the traces 40. As a result, the portions 46 of the traces 40 without epoxy 44 thereon tend to be weaker than those with the epoxy 44 thereon. Also, because the substrate 24 is not bonded to the chip 22 at the portions without epoxy 44, such portions may experience more flexing and/or elongation (e.g., during thermal gradients, vibrations, and/or impact shocks). The inventors of the present invention have studied and analyzed this problem of trace cracking in mico-BGA packages 20, as shown in FIGS. 2–8, and found that trace cracks tend to develop where there is no epoxy, and typically at the boundary or periphery of the epoxy layer 44.

Figure 2:
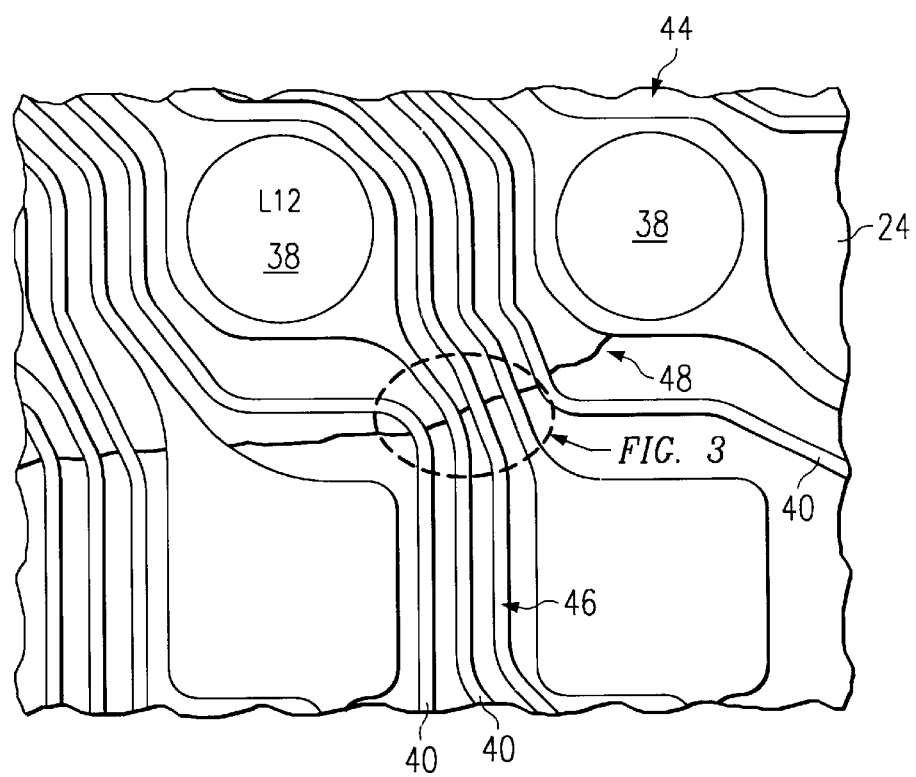
FIG. 2 is a top view of a substrate that has a trace cracked at contact L12.
Figure 3:
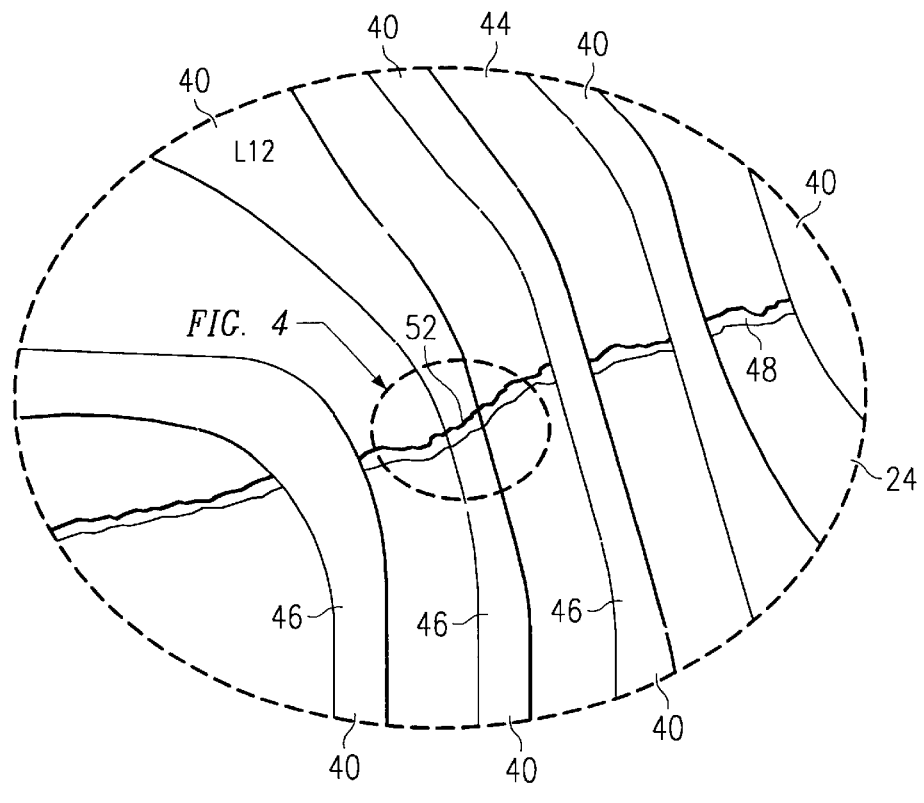
FIG. 3 is an enlarged view of a portion of FIG. 2.
Figure 4:
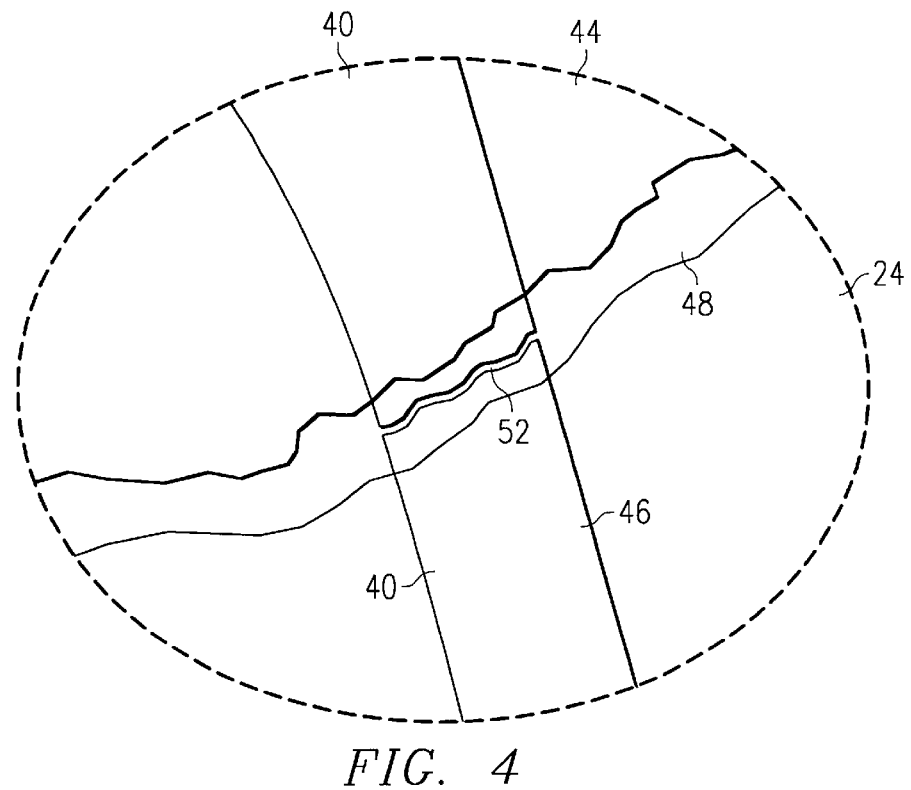
FIG. 4 is an enlarged view of a portion of FIG. 3.
Figure 5:
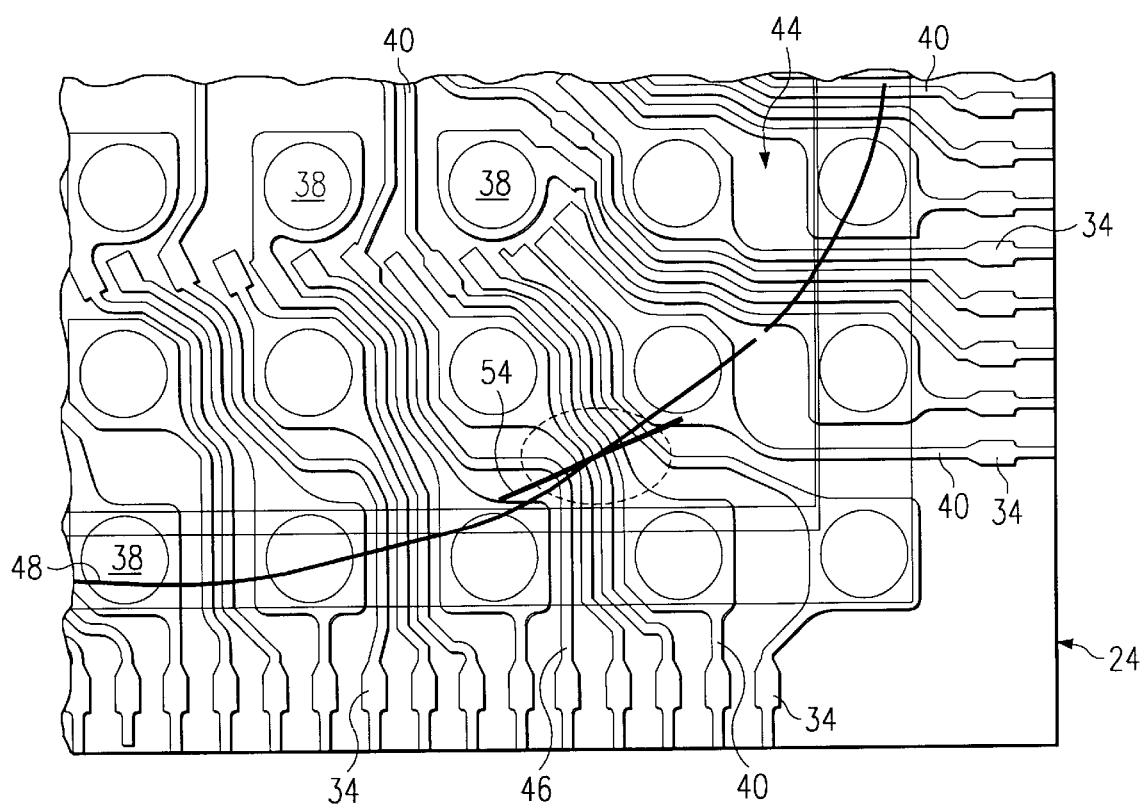
FIG. 5 is a schematic representation of the substrate of FIG. 2.

FIG. 2 is a top view of a substrate 24 that has a trace 40 cracked at contact L12. FIG. 3 is an enlarged view of the cracked trace 40 of FIG. 2. The white jagged line 48 extending across the traces 40 is the edge of the epoxy coverage area 44. FIG. 4 is an enlarged view of the L12 trace of FIGS. 2 and 3, which shows the crack 52 across the trace 40. Even though the crack 52 is only a micro-sized, it may still cause a discontinuity of electrical current along the trace 40 (i.e., no connect). FIG. 5 is a schematic of the substrate 24 shown in FIGS. 2–4. The epoxy coverage area 44 is on the upper left side of FIG. 5. The edge of the epoxy coverage area 44 is noted by a line 48 on the schematic. Another line 54 on FIG. 5 represents the crack profile for the crack 52 shown in FIG. 4. Note that the crack 52 shown in FIG. 4 is aligned with the edge 48 of the epoxy coverage area 44, as best shown in FIG. 3 and illustrated in FIG. 5.

Figure 6:
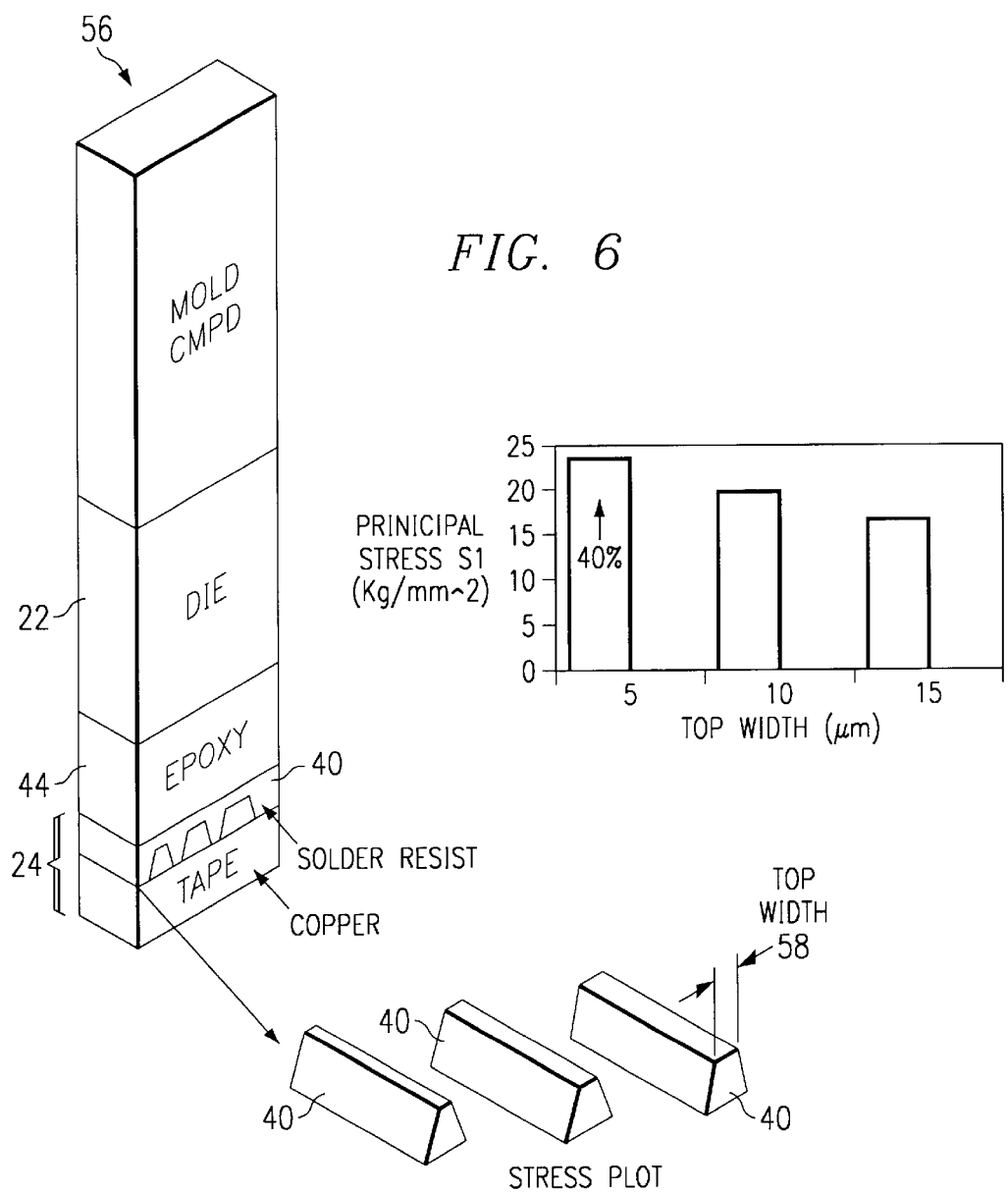
FIG. 6 shows a finite element analysis model and a results graph.

The inventors created a solid model 56 for the traces of various top widths 58 and performed a finite element stress analysis on the model 56. The etching processes involved in forming the traces 40 is what typical causes thinner top widths 58 on the traces. The finite element analysis sought to determine the principle stresses experience by the traces 40 during a temperature cycle test ranging from −40° C. to 125° C. The results of this analysis are shown in FIG. 6. The inventors noted that as the top width 58 of a trace 40 decreases, the principle stress on the trace increases. Because in actual conditions the top width 58 may vary, the inventors used the worse case scenario of a narrow top width 58 for the trace 40 to estimate the critical stresses experienced by the traces 40 for further calculations.

Figure 7A:
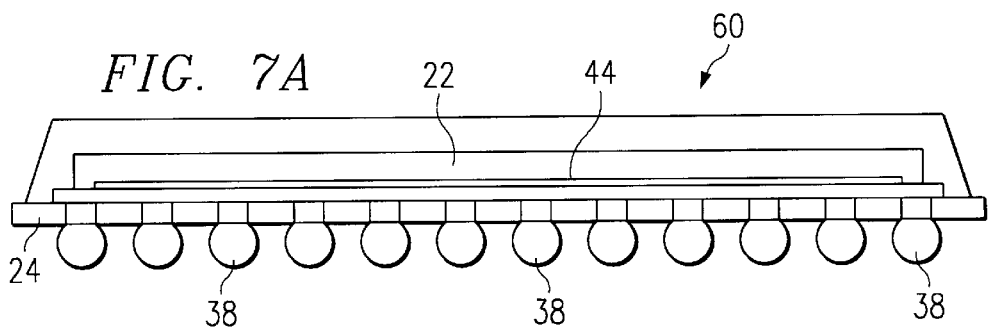
FIG. 7 shows a comparative finite element analysis with results.

Also, the epoxy coverage area 44 may vary in actual production. The inventors compared the principle stresses on a trace 40 for different percentages of epoxy coverage area 44. The best case would be 100% epoxy coverage. However, 100% epoxy coverage is not a practical target for production. At the low end of the spectrum, the inventors considered the case where there is only 75% epoxy coverage because the epoxy coverage area 44 will typically be more than 75%. In fact, a practical and obtainable target for the manufacturing specifications is 95% coverage for the epoxy layer 44. Thus, 75% coverage is likely to be the worst case scenario. The inventors prepared and evaluated a two-dimensional model 60 (see FIG. 7) for a micro-BGA packaged device 20, such as that shown in FIG. 1. As shown in FIG. 7, the case of 100% epoxy coverage results in an estimated principle stress on the traces 40 of 33.94 kg/mm$^2$. On the low end (i.e., worst case) for 75% epoxy coverage, the estimated principle stress on the traces 40 from the finite element analysis is 52.43 kg/mm$^2$, as shown in FIG. 7 also. These principle stresses in the finite element analysis occurred at the epoxy periphery line 48. Hence, the finite element analysis results agree with the actual findings (see FIGS. 2–5), which adds veracity to the finite element analysis results. The following table lists material properties for some examples of the commonly used copper based metals for traces 40.

| Properties | Unit | Electro-Deposited Copper Foils | | | |
|---|---|---|---|---|---|
| | | VLP | SLP | U-SLP | FQ-VLP |
| Purity | % | 99.8 | 99.8 | 99.8 | 99.8 |
| Weight per area | g/m$^2$ | 148 | 140 | 138 | 147.5 |
| Tensile strength | kg/mm$^2$ | 50 | 55 | 55 | 50 |
| Elongation | % | 7 | 5 | 5 | 7 |

Because the principle stress for the worst case scenario (i.e., 75% epoxy coverage) is greater than and very close to the tensile strength of the commonly used materials listed in the FIG. 7 table, there is a high probability of trace cracking. Thus, the occurrences of trace cracking during production is probably the result of either not having large enough traces (e.g., trace top widths too narrow) or the use of materials having insufficient properties.

Because the size of traces 40 will likely continue to shrink rather than grow as technology progresses, making the traces 40 larger (i.e., larger cross-section or larger top-width specifications) is not a preferable solution to the problem noted above. Therefore, the inventors came up with an embodiment of the present invention that utilizes traces 40 made from a copper-based metal having a tensile strength of more than about 60 kg/mm$^2$. The inventors also found that increasing the ductility slightly by using a copper-based metal having a percent elongation property of more than about 7% at room temperature, and/or about 7% at about 180° C., further increases the reliability of the substrate 24 and further decreases the likelihood of trace cracking in micro-BGA package substrates 24. Thus, an embodiment of the present invention having such material properties specified for the trace materials will increase the reliability of micro-BGA packaged devices 20 and should decrease or eliminate the occurrence of trace cracking.

Also, during testing (e.g., 500 cycle qualification testing), devices 20 made in accordance with an embodiment of the present invention will be less likely to experience trace cracking during reliability testing, and the risk of no-connect or missing electrical connects during device testing will be reduced. Furthermore, using an embodiment of the present invention will likely allow designers to optimize or maximize copper trace routing on all parts of the substrate design.

It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed:

1. A packaged semiconductor device comprising:
   a semiconductor chip including a plurality of conductive pads;
   a plurality of transistor circuits formed upon the semiconductor chip;
   a package substrate comprising first and second sides;
   a plurality of conductive terminals formed on the first side of the package substrate, at least one of the terminals being electrically coupled to at least one of the conductive pads;
   a plurality of contacts formed on the second side of the package substrate; and
   a plurality of traces disposed on the first side of the package substrate, each trace providing at least part of an electrical coupling between at least one of the terminals and at least one of the contacts, and the traces being formed from a metal having a tensile strength of more than about 60 kg per mm$^2$.

2. A device in accordance with claim 1, wherein the metal of the traces is a copper based material.

3. A device in accordance with claim 1, wherein the contacts are arranged in an array.

4. A device in accordance with claim 3, wherein the array is generally configured in a square grid.

5. A device in accordance with claim 1, wherein the contacts on the package substrate are arranged in a micro ball grid array within a generally square area having dimensions between about 3 mm by 3 mm and about 23 mm by 23 mm.

6. A device in accordance with claim 5, wherein the generally square area for the contacts has dimensions allowing a maximum spacing on each side of the chip of about 0.35 mm to the boundary of the area for the contacts.

7. A device in accordance with claim 1, wherein the package substrate is a micro ball grid array package substrate.

8. A device in accordance with claim 1, wherein the package substrate dimensions relative to the chip are such that the device is a chip-scale package.

9. A device in accordance with claim 1, wherein the package substrate is generally planar shaped and the first side faces an opposite direction with respect to the second side.

10. A device in accordance with claim 1, further comprising an epoxy layer between the chip and the substrate such that the epoxy layer is bonded to the chip and the substrate to aid in affixing the chip to the substrate.

11. A device in accordance with claim 1, wherein the substrate is a flex tape substrate.

12. A device in accordance with claim 11, wherein the substrate comprises a polyimide material.

13. A device in accordance with claim 1, wherein the substrate is a laminate substrate.

14. A device in accordance with claim 13, wherein the substrate comprises a bismaleimide-triazine resin material.

15. A device in accordance with claim 13, wherein the substrate comprises a flame retardant fiberglass composite substrate board.

16. A device in accordance with claim 1, wherein the substrate comprises a ceramic substrate material.

17. A device in accordance with claim 1, wherein the metal of the traces also has a percent elongation of at least about 7% at room temperature.

18. A device in accordance with claim 1, wherein the metal of the traces also has a percent elongation of at least about 7% at 180° C.

19. A semiconductor device having a micro ball grid array package, comprising:
    an integrated circuit chip comprising a plurality of conductive pads and a plurality of transistor circuits, wherein at least some of the conductive pads are electrically coupled to at least some of the transistor circuits;
    a micro ball grid array package substrate having a first side and a second side;
    a plurality of conductive terminals formed on the first side of the micro ball grid array package substrate, at least one of the terminals of the micro ball grid array package substrate being electrically coupled to at least one of the conductive pads of the integrated circuit chip;
    an array of generally ball-shaped contacts formed on the second side of the micro ball grid array package substrate; and
    a plurality of traces formed on the first side of the package substrate, each trace providing at least part of an electrical coupling between at least one of the terminals and at least one of the contacts, and the traces being formed from a copper based metal having a tensile strength of more than about 60 kg per $mm^2$.

20. A device in accordance with claim 19, wherein the metal of the traces also has a percent elongation of at least about 7% at room temperature.

21. A device in accordance with claim 19, wherein the metal of the traces also has a percent elongation of at least about 7% at 180° C.

22. A semiconductor device having a micro ball grid array package, comprising:
    an integrated circuit chip comprising a plurality of conductive pads and a plurality of transistor circuits, wherein at least some of the conductive pads are electrically coupled to at least some of the transistor circuits;
    a micro ball grid array package substrate having a first side and a second side;
    a plurality of conductive terminals formed on the first side of the micro ball grid array package substrate, at least one of the terminals of the micro ball grid array package substrate being electrically coupled to at least one of the conductive pads of the integrated circuit chip;
    an array of generally ball-shaped contacts formed on the second side of the micro ball grid array package substrate;
    a plurality of traces formed on the first side of the package substrate, each trace providing at least part of an electrical coupling between at least one of the terminals and at least one of the contacts, and the traces being formed from a copper based metal having a tensile strength of more than 60 kg per $mm^2$ and a percent elongation of at least about 7% at room temperature.

* * * * *